(12) United States Patent
Spearing

(10) Patent No.: US 8,833,097 B2
(45) Date of Patent: Sep. 16, 2014

(54) COOLING FLUID FLOW REGULATION DISTRIBUTION SYSTEM AND METHOD

(75) Inventor: Ian Spearing, Westerville, OH (US)

(73) Assignee: Liebert Corporation, Columbus, OH (US)

( * ) Notice: Subject to any disclaimer, the term of this patent is extended or adjusted under 35 U.S.C. 154(b) by 19 days.

(21) Appl. No.: 13/185,637

(22) Filed: Jul. 19, 2011

(65) Prior Publication Data

US 2011/0272125 A1    Nov. 10, 2011

Related U.S. Application Data

(63) Continuation of application No. 12/032,930, filed on Feb. 18, 2008, now Pat. No. 8,011,200.

(60) Provisional application No. 60/890,555, filed on Feb. 19, 2007.

(51) Int. Cl.
*G06F 1/20* (2006.01)
*H05K 7/20* (2006.01)
*F28D 15/00* (2006.01)
*F28F 9/02* (2006.01)

(52) U.S. Cl.
CPC ........ *H05K 7/20281* (2013.01); *H05K 7/20645* (2013.01); *H05K 7/20* (2013.01); *F28D 15/00* (2013.01); *G06F 1/20* (2013.01); *F28F 9/02* (2013.01)
USPC ....................................................... 62/259.2

(58) Field of Classification Search
CPC .......... H05K 7/20281; H05K 7/20645; F25B 2341/06; F25B 2341/067
USPC ................ 62/199, 200, 525, 527, 259.2, 511; 361/699, 726, 689, 701–704, 711, 361/717–719
See application file for complete search history.

(56) References Cited

U.S. PATENT DOCUMENTS 3,481,393 A * 12/1969 Chu .............................. 165/80.4
4,125,101 A    11/1978 Garcia et al.
(Continued)

FOREIGN PATENT DOCUMENTS

EP    1448040    8/2004
EP    1448040 A2 *  8/2004    ............... H05K 7/20
(Continued)

OTHER PUBLICATIONS

Schneider, F., International Search Report for International Patent Application No. PCT/US2008/054293, dated Sep. 29, 2008, European Patent Office.

(Continued)

*Primary Examiner* — Frantz Jules
*Assistant Examiner* — Emmanuel Duke
(74) *Attorney, Agent, or Firm* — Locke Lord LLP

(57) ABSTRACT

The disclosure provides systems and methods for regulating and distributing cooling fluid through a plurality of heat sinks, such as cold plates, using a flow regulator, which sets the total flow rate, in combination with one or more individual orifices that allow further flow distribution as required by individual cold plates, despite flow variations upstream of the orifices. An orifice can be coupled to an orifice holder, which includes a body to support the orifice, and which may be coupled (directly or indirectly) to an inlet of the cold plate. Alternative manners of coupling orifices in the fluid flow besides an orifice holder can be employed. Generally, the flow regulator(s) is coupled with a plurality of orifices and conduits through which the cooling fluid flows. Related system components can be assembled as a module for installation into a cooling system that includes other system components such as a pump, compressor or other pressure sources for the cooling fluid.

19 Claims, 4 Drawing Sheets

(56) References Cited

U.S. PATENT DOCUMENTS

| | | | |
|---|---|---|---|
| 4,448,540 A | 5/1984 | McLeod | |
| 4,522,037 A | 6/1985 | Ares et al. | |
| 4,999,102 A | 3/1991 | Cox et al. | |
| 5,509,468 A | 4/1996 | Lopez | |
| 5,701,937 A | 12/1997 | Bourboulou et al. | |
| 5,815,370 A * | 9/1998 | Sutton | 361/699 |
| 5,816,070 A | 10/1998 | Meckler | |
| 6,307,746 B1 | 10/2001 | Beckman | |
| 6,415,619 B1 * | 7/2002 | Bash et al. | 62/228.4 |
| 6,519,955 B2 * | 2/2003 | Marsala | 62/119 |
| 6,622,939 B2 | 9/2003 | Swanson | |
| 6,698,509 B2 | 3/2004 | Rong | |
| 6,904,968 B2 | 6/2005 | Beitelmal et al. | |
| 6,926,078 B2 | 8/2005 | Beitelmal et al. | |
| 6,958,911 B2 | 10/2005 | Cader et al. | |
| 7,063,276 B2 | 6/2006 | Newton | |
| 7,245,495 B2 | 7/2007 | Ouyang | |
| 7,254,957 B2 | 8/2007 | Weber et al. | |
| 7,420,808 B2 | 9/2008 | Campbell et al. | |
| 7,641,101 B2 | 1/2010 | Campbell et al. | |
| 7,845,185 B2 | 12/2010 | Knight et al. | |
| 2002/0007641 A1 | 1/2002 | Marsala | |
| 2003/0147214 A1 | 8/2003 | Patel et al. | |
| 2005/0252222 A1 * | 11/2005 | Jessen et al. | 62/175 |
| 2006/0090397 A1 * | 5/2006 | Edlund et al. | 48/61 |
| 2006/0112702 A1 | 6/2006 | Martin et al. | |
| 2008/0092387 A1 | 4/2008 | Campbell et al. | |

FOREIGN PATENT DOCUMENTS

| | | |
|---|---|---|
| EP | 1548380 | 6/2005 |
| GB | 2229293 | 9/1990 |

OTHER PUBLICATIONS

Schneider, F., Written Opinion for International Patent Application No. PCT/US2008/054293, dated Sep. 29, 2008, European Patent Office.

Becamel, P., International Patent Report on Patentability for International Patent Application No. PCT/US2008/054293, dated Aug. 19, 2009, The International Bureau of WIPO, Switzerland.

* cited by examiner

COOLING FLUID FLOW REGULATION DISTRIBUTION SYSTEM AND METHOD

CROSS REFERENCE TO RELATED APPLICATIONS

The present application claims priority to U.S. Provisional patent application Ser. No. 12/032,930, filed Feb. 18, 2008, which claims priority to U.S. Provisional Patent Application Ser. No. 60/890,555, filed Feb. 19, 2007, the contents of both of which are incorporated herein by reference in its entirety.

STATEMENT REGARDING FEDERALLY SPONSORED RESEARCH OR DEVELOPMENT

Not applicable.

REFERENCE TO APPENDIX

Not applicable.

BACKGROUND OF THE INVENTION

The present invention relates generally to cooling fluid flow and control, and more particularly, to methods and systems for ensuring evenly distributed cooling fluid flow to a group of electrical device cooling components.

Many industries use various types of electronic devices, such as computer servers and other electronic devices having electronic processors and sensors that generate heat during use. The electronic devices are frequently attached to racks capable of supporting the electronic devices and require the continuous removal of heat for proper operation. With the ongoing shrinkage of electronic devices, the use of air as a cooling medium has reached a limitation on how much heat can be reasonably removed with a reasonably attainable air stream. Accordingly, an improved cooling method employs direct conduction cooling from a cooling fluid stream flowing within one or more heat sinks used in this field, generally known as "cold plates," that contact either the components themselves or the heat rejection plate of a secondary cooling loop in contact with the components.

The cold plates require a sufficient flow of cooling fluid that is significantly lower than flow rates previously encountered in air heat exchanger applications and even in other fluid cooled applications. Other applications can use commercially available spring-based flow regulators. However, considering the typical nature, size and number of cold plates needed for the cooling of many electronic devices, there are no commercially available spring-based flow regulators of the required flow rate and flow range tolerances for such important but low thermal loads as associated with electronics systems. Additionally, commercial development of a spring-based flow regulator is not economically practical and the resulting product would expect to suffer from unsuitably wide performance tolerances.

Therefore, there is a need for a cooling fluid delivery system that addresses these shortcomings. The present disclosure provides improved systems and methods for metering the flow of a cooling fluid for cooling a group of electrical devices. Moreover, the system and method herein help ensure that the total flow is, with a high tolerance for input variations, evenly distributed among the cooling components for the electrical devices where the individual components would not suitably be metered separately with standard flow regulators.

BRIEF SUMMARY OF THE INVENTION

Generally, the present disclosure provides systems and methods for regulating and distributing cooling fluid through a plurality of heat sinks, such as cold plates, using a flow regulator, which sets the total flow rate, combined with individual orifices that allow further flow distribution as required by individual cold plates, despite flow variations both upstream and downstream of the orifices. An orifice can be coupled to an orifice holder, which includes a body to support the orifice, and may be coupled (directly or indirectly) to an inlet of the cold plate. Alternative manners of coupling orifices in the fluid flow besides an orifice holder can be employed, as appropriate. Generally, the flow regulator(s) described herein are coupled with a plurality of orifices and conduits through which the cooling fluid flows. Related system components may also be assembled as a module for installation into a cooling system that includes other system components such as a pump, compressor or other pressure sources for the cooling fluid.

In accordance with an aspect of the present disclosure, systems are provided for regulating and distributing cooling fluid flow through a plurality of cold plates coupled to one or more electronic devices, wherein the systems comprise a flow regulator fluidicly coupled to a system pressure source; a distribution header fluidicly coupled to the flow regulator; a plurality of cooling fluid lines fluidicly coupled to the distribution header; at least two orifices, each of the orifices being coupled to a cooling fluid line downstream of the flow regulator and the distribution header; and a plurality of cold plates coupled to the plurality of fluid lines downstream of the orifices.

In a related aspect of the present disclosure, systems are provided for the regulation and distribution of one or more cooling fluids through a plurality of cold plates adjoining one or more electronic devices or similar heat-generating assemblies within a cooling rack, wherein the system comprises a flow regulation means; a fluid flow distribution means coupled to the flow regulation means; a plurality of cooling fluid delivery means; one or more orifices associated with the cooling fluid delivery means downstream of the flow regulation means and the fluid flow distribution means; and a plurality of cold plates coupled to the plurality of fluid lines downstream of the orifices.

In yet another aspect of the present disclosure, methods are provided for regulating and distributing cooling fluid flowing through at least one flow regulator, a plurality of orifices, and a plurality of cold plates coupled to one or more electronic devices, wherein the methods comprise flowing the cooling fluid through the at least one flow regulator to the plurality of orifices; reducing a flow pressure through the plurality of orifices, such as reducing a flow pressure from a first fluid flow pressure to a second fluid flow pressure through the plurality of orifices; and flowing the reduced pressure cooling fluid through the cold plates for cooling the cold plates and absorbing heat from the one or more electronic devices.

BRIEF DESCRIPTION OF THE SEVERAL VIEWS OF THE DRAWINGS

The following figures form part of the present specification and are included to further demonstrate certain aspects of the present invention. The invention may be better understood by reference to one or more of these figures in combination with the detailed description of specific embodiments presented herein.

Figure 1:
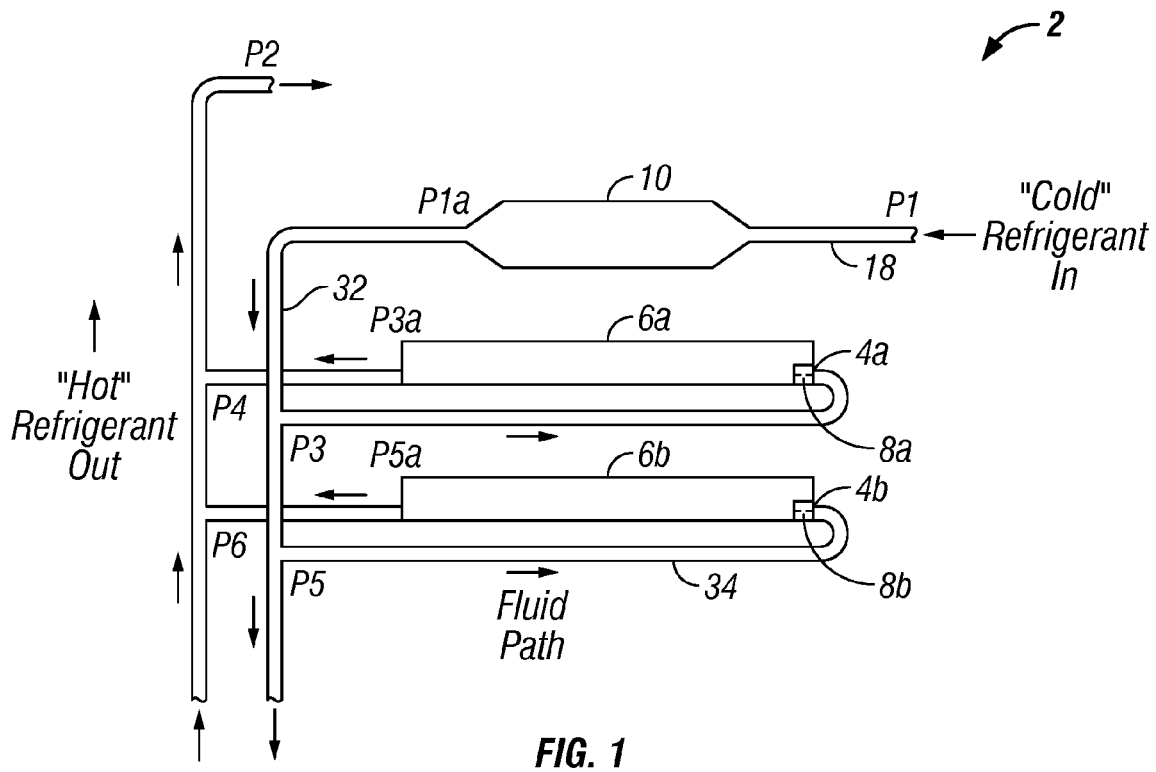
FIG. 1 illustrates an exemplary embodiment of a module having a flow regulator and a plurality of cold plates, each cold plate including an inlet coupled to an orifice.

While the inventions disclosed herein are susceptible to various modifications and alternative forms, only a few specific embodiments have been shown by way of example in the drawings and are described in detail below. The figures and detailed descriptions of these specific embodiments are not intended to limit the breadth or scope of the inventive concepts or the appended claims in any manner. Rather, the figures and detailed written descriptions are provided to illustrate the inventive concepts to a person of ordinary skill in the art and to enable such person to make and use the inventive concepts.

DETAILED DESCRIPTION

The Figures described above and the written description of specific structures and processes below are not presented to limit the scope of what Applicants have invented or the scope of protection for those inventions. Rather, the Figures and written description are provided to teach any person skilled in the art to make and use the inventions for which patent protection is sought. Those skilled in the art will appreciate that not all features of a commercial implementation of the inventions are described or shown for the sake of clarity and understanding. Persons of skill in this art also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. The inventions disclosed and taught herein are susceptible to numerous and various modifications and alternative forms. Lastly, the use of a singular term is not intended as limiting of the number of items. Also, the use of relational terms, such as, but not limited to, "top," "bottom," "left," "right," "upper," "lower," "down," "up," "side," and the like are used in the written description for clarity in specific reference to the Figures and are not intended to limit the scope of the invention or the appended claims. Furthermore, the term "coupled," "coupling," "coupler," and like terms are used broadly herein and can include any method or device for securing, binding, bonding, fastening, attaching, joining, inserting therein, forming thereon or therein, communicating, or otherwise associating, for example, mechanically, magnetically, electrically, chemically, directly or indirectly with intermediate elements, one or more pieces of members together and can further include without limitation integrally forming one functional member with another in a unity fashion. The coupling can occur in any direction, including rotationally.

Generally, applicants have created systems and methods of regulating and uniformly distributing cooling fluid through one or more cold plates using a combination of one or more flow regulators fluidicly coupled in the stream of cooling fluid flow with a plurality of orifices fluidicly coupled downstream of the regulator. Furthermore, more than one orifice can be coupled downstream of each regulation device, each orifice being fluidicly coupled to one or more cold plates. As used herein, the terms "cooling fluid," "refrigerant," and similar terms are used interchangeably and refer to a substance used to provide cooling, such as ammonia, water, carbon dioxide, or other substances capable of providing cooling. Exemplary cooling fluids or refrigerants suitable for use with the systems and methods described herein include but are not limited to liquid water (also referred to as a non-evaporating or "phase change" coolant), water-methanol solutions, and FREON® (any of a number of several chlorofluorocarbons used in commerce and industry, numerous of which are aliphatic organic compounds containing at least carbon and fluorine, such as HFC and HCFC), hydrofluorocarbons, such as the SUVA® brand of refrigerants (DuPont), bis-(difluoromethyl) ether refrigerants, carbon dioxide ($CO_2$), including gaseous carbon dioxide, transcritical carbon dioxide, and liquid $CO_2$, or hybrid coolants such as the Liebert XD® Coolant refrigerant system (Liebert Corporation, Columbus, Ohio), wherein the coolant is a gas at atmospheric temperature and/or pressure, but can be pumped as a liquid.

The term "plurality", as used herein, is meant to refer to numbers of devices, apparatus, etc. of at least two, and preferably more than two, up to including 1000. Further, the term "cold plate," as used herein, includes a component capable of being coupled to an electronic device and absorbing heat therefrom and includes heat sinks and evaporators. Different embodiments of this invention may incorporate a number of devices that set the total flow rate, including flow regulators, flow controllers with mass flow feedback control hardware or software, metering valves, or any other similar devices that herein are generally referred to as a "flow regulator."

Similarly, as used herein, the term "orifice" is meant to refer to the delivery passage or means, such as an opening or hole, for regulating the relative pressures, particularly by way of pressure drops, at various points within one or more portions of the systems described herein. Orifices can be of a number of different sizes, shapes, styles and paths of restrictions, including but not limited to straight-hole orifices, sharp-edge orifices, rounded edge orifices, tapered hole orifices (such as those extending outwardly or inwardly from an inlet to a cold plate or vice-versa), tortuous path orifices of varied length, straight path orifices of varied length, and the like, as well as fixed restrictions and adjustable restriction devices and means, such as metering valves, or adjustable restriction means that are set and then fixed at a specific restriction. Generally speaking, the orifices are refrigerant communicating means extending between two or pore points within sections of the systems described herein, such as between an inlet 4 and a cold plate 6. As noted above, the inlet and/or outlet orifices can act to throttle the flow of cooling gas or refrigerant to or from the electronic devices housed within a rack 17 or similar structure and can provide a desired flow rate into and through the system, which can be adjusted as desired for particular structures and systems to be cooled by varying the diameter or form of the orifice.

Figure 2A:
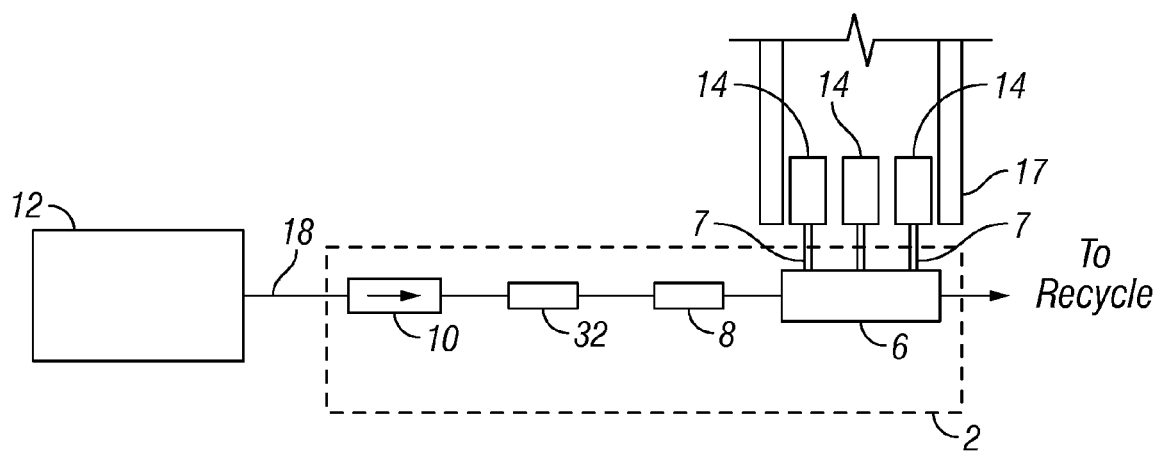
FIG. 2A illustrates a schematic of an exemplary system using the module of FIG. 1.

Turning now to the figures, FIG. 1 illustrates an exemplary embodiment of a module having a flow regulator and a plurality of cold plates, each cold plate including an inlet coupled to an orifice. FIG. 2A illustrates a schematic illustrating an exemplary system using the module of FIG. 1. The figures will be described in conjunction with each other. A system pressure source 12 such as a pump, compressor, pressurized cylinder, or other pressure source 12 pressurizes a cooling fluid in a feed line 18, so that the fluid flows through a cooling module 2. The module 2 can comprise a flow regulator 10, a distribution header 32 having a plurality of fluid distribution lines 34, a plurality of inlets 4, and a plurality of cold plates 6, wherein the inlets have one or more orifices 8 for more uniformly distributing the cooling fluid flow to the plurality of cold plates 6. Each inlet 4a, 4b (collectively referred to as "inlet(s) 4") can be coupled to orifices 8a, 8b (collectively referred to as "orifice(s) 8"), such that the combination of an orifice 8 and a commercial flow regulator 10 produces a suitable flow rate of cooling fluid entering a particular cold plate 6a, 6b (collectively referred to as "cold plate(s) 6"). A flow regulator 10 may be a commercially available regulator that modulates the total flow rate through a system by spring balancing a piston. One of ordinary skill in the art will readily realize that a number of such regulators are widely available, but that a regulator 10 can also be custom manufactured for a specific application. Cooling fluid flows from the pressure source 12 through the flow regulator 10, through the distribution header 32, through a plurality of fluid lines 34, through the inlets 4, through the orifices 8, and through the cold plates 6. The cooling fluid flows through the cold plate 6, absorbing heat from one or more electrical devices 14 coupled to the cold plate, directly or indirectly, such as through a heat rejector plate 15 (not shown) attached to, in fluid connection with, or associated with the cold plate 6. The electrical devices can be supported and/or contained within a rack 17 or similar device as known to those with ordinary skill in the art. Thereafter, upon exiting the cold plate 6, the cooling fluid flows in a recycle loop back to a system pressure source or to a disposal destination. Heat/thermal transfer from the electrical devices 14 to the cold plate 6, absent the use of a heat rejector plate, may be by way of thermal (heat transfer only) lines 7, or an equivalent heat transfer arrangement. One of ordinary skill will also realize that the cooling fluid may flow through various system components which may not be specifically illustrated herein, including lines, valves, pumps, condensers, or other components common to one or more pressurized cooling fluid systems and such are not deemed necessary for detailed description, but can be included in the presently described systems.

Figure 2B:
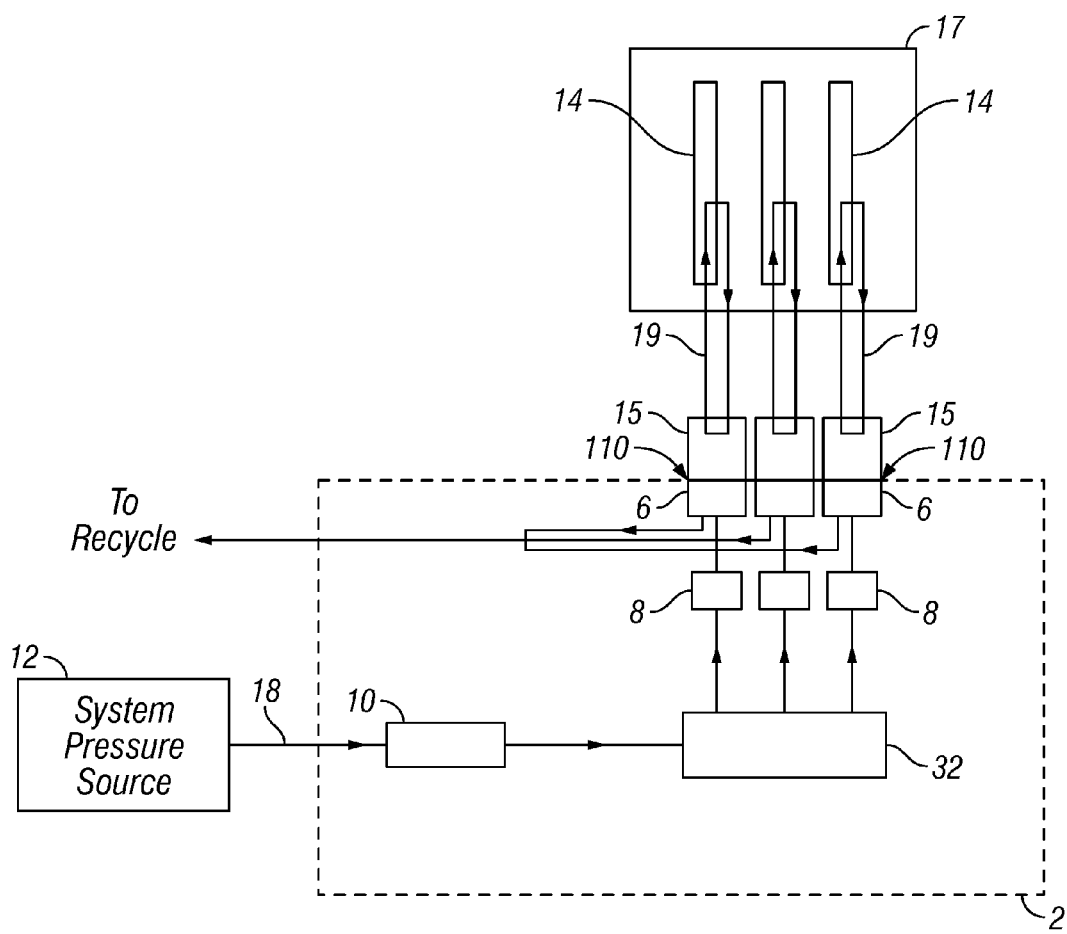
FIG. 2B illustrates a schematic of an alternate exemplary system using a module as illustrated in FIG. 1.

FIG. 2B illustrates a schematic of an alternate exemplary system using a module as illustrated in FIG. 1, showing the inclusion of one or more heat rejector plates 15. Similar to the system described above in FIG. 2A, cooling fluid flows from a pressure source 12 via feed line 18 through flow regulator 10, and then through the distribution header(s) 32, 33 (see, e.g., FIG. 3), which distributes the fluid through a plurality of fluid lines via inlets (not shown), through the shaped orifices 8, and through the one or more cold plates 6. The cooling fluid flows through the one or more cold plates 6 which are in thermal communication with one or more heat rejector plates 15, and upon exiting the cold plate 6, the cooling fluid flows in a recycle loop back to a system pressure source or to a disposal destination (not shown), as appropriate. Heat rejector plate(s) 15 rejects heat to cold plate 6 via direct thermal contact or indirect contact such as by an interposing solid, fluid, or gas medium. The heat rejected by rejector plates 15 is provided by a separate fluid circulation loop 19 wherein the cooling fluid has gained heat by circulating through, around, or near one or more electrical devices 14 contained within rack 17 via loop 19. One of ordinary skill in the art can recognize that the cooling fluid flow through the rejector plate 15 can be driven by a compressor, pump, or thermal siphon such as a heat pipe or similar fluid-conveyance type devices, or similarly driven flow means (not shown), such as those described in U.S. Patent Publication No. 2007/0201210 A1, incorporated herein by reference in pertinent part. Alternatively, the heat rejector plates 15 may also be directly coupled to the electrical devices 14, or be a direct part of the electrical devices themselves, as appropriate. Further, and equally acceptable, the heat rejector plates 15 and the chassis cold plates 6 may include a thermal interface material 110 intermediate between the two plates, thereby improving heat exchange by substantially eliminating air gaps. However, the heat rejector plates 15 and cold plates 6 may still form a separable heat exchange unit, allowing for one or more cooling systems to be separated without having to disconnect any of the fluid carrying lines 18 in the system.

The desired flow rate for a cold plate 6 may be determined by, for example, the characteristics of the particular cold plate 6 and reached through an appropriate combination of a flow regulator 10 and the orifices 8 and the associated fluid flow pressures (P1, P2, etc) within and across such devices. In accordance with the present disclosure, the pressure drop across each orifice 8 is less than the available system pressure differential, which may be determined, for example, by determining the difference between the pressure capabilities of the system pressure source 12 and the pressure downstream of the cold plates 6. This determination can be made, for example (and without limitation), by determining the difference between pressures at points P1 within feedline 18 and P2 in the return lines carrying "hot" refrigerant out and away from the electronic devices 14 within rack 17. Additionally, and in accordance with one aspect of the present disclosure, the pressure drop across each orifice 8 from fluid line 34 and inlet 4 into cold plate 6 is generally at least about 1%, about 5%, about 10%, about 15%, or advantageously about 20% greater than any flow path pressure drop variation, or any percentage within the range from about 1% to about 20%. In accordance with a further aspect of the present disclosure, the pressure drop across each orifice 8 from fluid lines 34 and/or inlet 4 into cold plates 6 may be greater than about 20%, ranging from about 20% to about 5000%, including pressure drops of about 30%, about 40%, about 50%, about 60%, about 70%, about 80%, about 90%, about 100%, about 200%, about 300%, about 400%, about 500%, about 600%, about 700%, about 800%, about 900%, about 1000%, about 2000%, about 3000%, about 4000%, and about 5000% greater than any flow path pressure drop variation, including percentages falling between any two of these values, such as from about 20% to about 70%, or from about 50% to about 500%, without limitation. Higher percentages can be used, but may result in flow inefficiencies and higher pressure losses, depending upon the specifics of the cooling system. In one embodiment of the present disclosure, the pressure drop across each of the orifices 8 is about five times the pressure drop variation. The flow path pressure drop variation includes the sum of any pressure drop variations associated with component manufacturing tolerances, component elevation differences, flow path tubing layout, sizing, component, or style pressure drop differences, thermal load variation induced pressure differences and other differences that would ordinarily contribute to a different pressure at the inlet 4 of the component to be regulated. In at least one embodiment of the present disclosure, the flow path pressure drop variation may be determined without the orifices 8 installed, where the difference in pressure can be measured, for example, between points P3 and P4 and between points P5 and P6, and these two differences compared, and so on with further cold plates. Thereafter, the system can be configured such that the pressure drop across each orifice 8 is, for example, at least 5% greater than the largest flow path pressure drop variation. The orifices 8 may have some influence on the total flow rate by their impact on the total of the fluid path resistances and their distribution among the various system components. These influences in turn may have an impact on one or more preferred embodiments for a given cooling application. Advantageously, the use of properly sized orifices 8 is more cost effective and results in smaller flow variations between the cold plates 6 than the use of currently available flow regulators.

Regarding the pressures, while an exemplary six pressures of interests (P1-P6) have been described herein, and are detailed further below, it will be recognized that the number of pressure points and regions will be directly related to the system itself, and so in accordance with the present disclosure there may be a plurality of pressures P1, P2, P3, P4, P5, P6, . . . $P_n$, as appropriate. With regard to the pressures referred to in the figures, P1 is a delivery pressure from the system at "high" pressure (such as from the pump, etc.), while P1*a* is the delivery pressure from the flow regulator to be delivered to the cold plate modules 6. Pressures P3 and P5 are delivery pressures to the various modules, and which may be slightly different in their pressure values due to elevation differences, tubing dimensional differences, tubing length differences, and the like. Pressures P3*a* and P5*a* are the pressures after going through the orifices 4 into the cold plates 6, while pressures P4 and P6 are the pressures after going through the cold plates and collecting in the return line, slightly different due to elevations, tubing dimensional (width, size, shape and length) differences, and the like. Pressure P2 is the return pressure to the system, typically at a "low" pressure as the cooling fluid is returned to the pump. In an exemplary setup, and without limitation, the plurality of pressures P1 to $P_n$ may have a number of difference pressure relationships inter-related to each other, depending upon the overall design and setup of the cooling system and the electronic devices to be cooled. For example, in the embodiment illustrated in FIG. 1, P1 is typically greater than P1*a*, since the flow regulator 10 reduces the supply pressure to near the orifice delivery pressure. Pressure P1*a* may be approximately equal to pressures P3 and P5, but can differ as suggested above due to elevation differences, tubing size, shape and dimension differences, etc, with such differences being a part of the necessary "flow path variation". Pressures P3*a* and P5*a* are typically less than pressures P3 and P5, due at least in part to the pressure drop across the orifices. Pressure P3*a* may be approximately equal to pressure P5*a*, but it may also be different, in part due to flow path variations. Pressures P4 and P6 are typically less than pressures P3*a* and P5*a* due, at least in part, to pressure drops through and/or across the cold plate(s). Pressure P4 maybe approximately equal to pressure P6, but it may also be different, due in part to cold plate differences, elevation differences, tubing dimensional and size differences and the like that are a part of typical flow path variation. Finally, the return pressure P2 is typically less than P4 and P6 in order to return the cooling fluid to a pump or the like for recycling.

Figure 3:
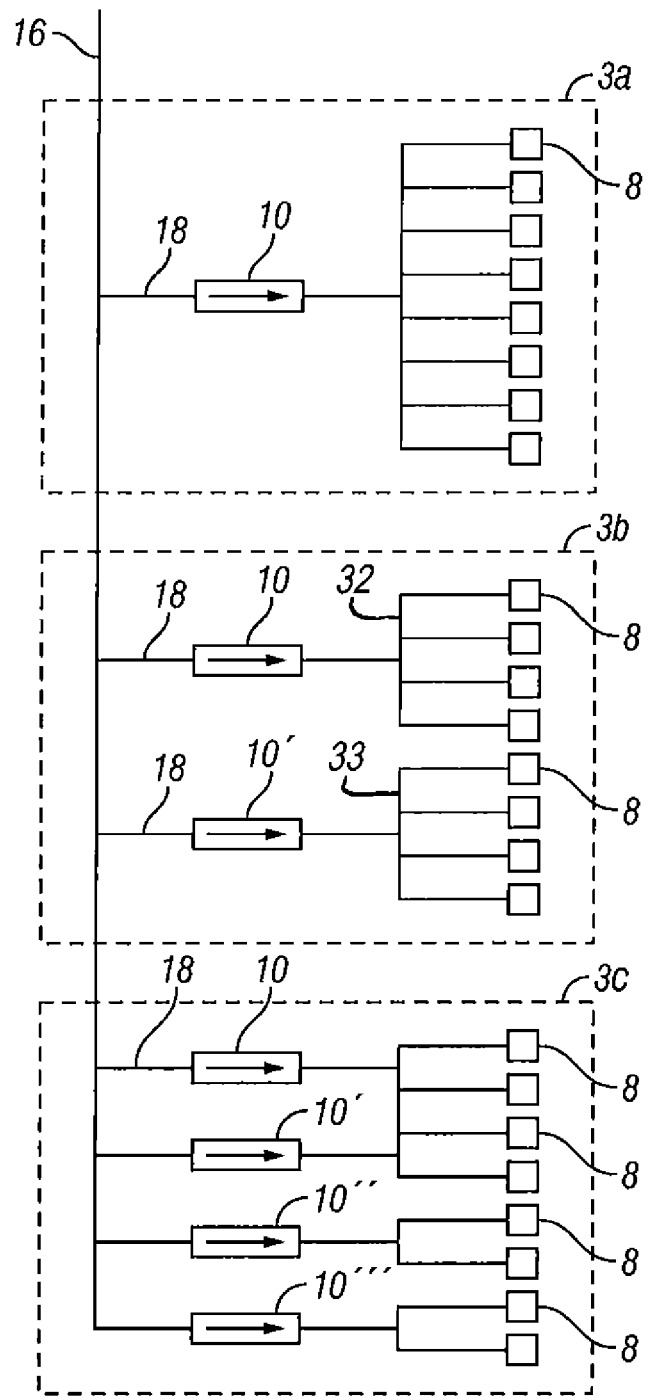
FIG. 3 illustrates a general piping schematic illustrating exemplary embodiments of the cooling modules.

FIG. 3 illustrates a piping schematic showing exemplary embodiments of the cooling modules described herein. Cooling fluid can enter the system through one or more primary feed line 16 and continues through one or more secondary feed lines 18 to one or more flow regulators 10. The flow regulators 10 control the downstream flow to the inlet 4 with the one or more orifices 8 leading into cold plates 6, as shown in FIGS. 1 and 2, and the resulting flow rate downstream of an orifice 8 is that desired for a chosen cold plate 6 in accordance with a particular application. The exemplary three embodiments of the modules 3*a*, 3*b*, and 3*c* illustrate different ratios of flow regulators 10 to orifices 8 which may be used, in accordance with the present disclosure. One or more modules of any particular design can be used in an overall system as may be appropriate for the particular cooling needs. In module 3*a*, for example, a single regulator 10 controls the system flow of cooling fluid to that module that is distributed to a plurality of lines and orifices, here shown as a ratio of one regulator to eight orifices, or a ratio of 1:8. The module 3*b* includes two regulators 10 and 10' that each control the flow rate of cooling fluid to four orifices 8, so that a ratio of regulator to orifice is 1:4. Similarly, in the module 3*c*, four regulators four regulators (10, 10', 10" and 10''') each control the cooling fluid flow rate to two orifices for a ratio of 1:2. These embodiments are not meant to be exclusive, but rather are three non-limiting examples to illustrate some of the numerous combinations that may be made using the systems and methods described herein. For example, it is envisioned that the ratio of flow regulators to orifices may range from 1:20 to 1:2, including 1:15, 1:12, 1:10, 1:6, 1:5, 1:3 and ratios within this range of ratios, inclusive, such as from 1:20 to 1:2, or from 1:8 to 1:2. One of ordinary skill in the art having the benefit of this disclosure will readily appreciate that these ratios are application specific and may be determined using principles of fluid dynamics and factors discussed herein.

Figure 4:
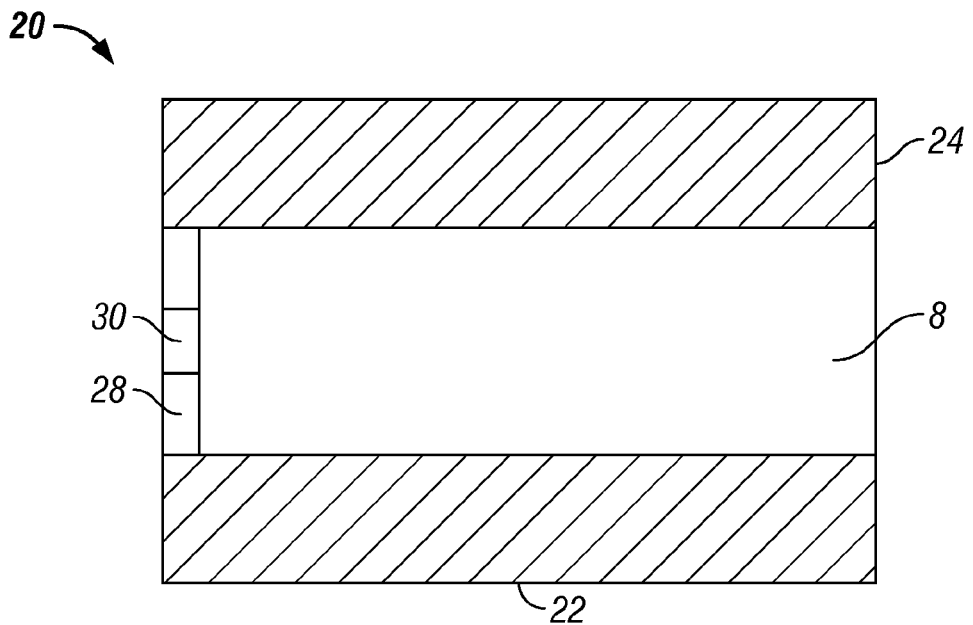
FIG. 4 illustrates a cross-sectional view of an exemplary orifice holder.
Figure 5:
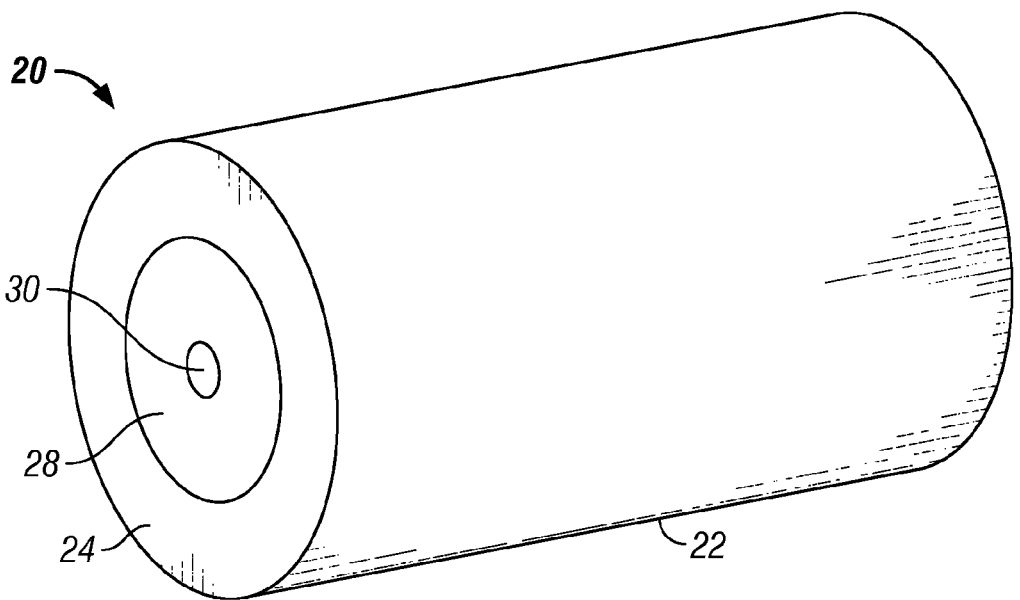
FIG. 5 illustrates a perspective view of the exemplary orifice holder shown in FIG. 4.

FIG. 4 illustrates a cross-sectional view of an exemplary orifice structure 20 for use in conjunction with the systems of the present disclosure. FIG. 5 illustrates a perspective view of the exemplary orifice structure 20 illustrated in FIG. 4. These figures will be described in conjunction with each other. An orifice structure 20 generally comprises an orifice 8 and a body 24. The orifice structure 20, in particular the body 24, can be provided from commercial suppliers or custom manufactured for a particular application. The outer surface 22 of the body 24 can be varied by application to allow appropriate methods of coupling the orifice 8 in a path of fluid flow. Common non-limiting examples include threaded surfaces, smooth surfaces for press-fit applications, and notched surfaces for crimping into place. Once affixed, a face 28 of an orifice 8 obstructs the path of fluid, while a thru-hole 30 allows a desirable volume of fluid to pass through the orifice 8. Additionally, the orifice may be incorporated directly into the design of the inlet of the cold plate. The orifice is herein shown as circular and cylindrical, but may alternately be formed in other shapes as deemed desirable from manufacturing and flow regulation considerations, including consisting of a tortuous path, or multiple tortuous flow paths, sudden expansions or contractions, or the like.

Other and further embodiments can be devised without departing from the general disclosure thereof. For example, any number of regulators 10 and orifices 8 can be combined to achieve desired fluid characteristics at the inlets 4 of one or more cold plates 6 in accordance with the requirements of a particular cooling application. Further, the various methods and embodiments of the improved fluid system can be included in combination with each other to produce variations of the disclosed methods and embodiments. Discussion of singular elements can include plural elements and vice-versa.

The order of steps can occur in a variety of sequences unless otherwise specifically limited. The various steps described herein can be combined with other steps, interlineated with the stated steps, and/or split into multiple steps. Similarly, elements have been described functionally and can be embodied as separate components or can be combined into components having multiple functions.

The inventions have been described in the context of preferred and other embodiments and not every embodiment of the invention has been described. Obvious modifications and alterations to the described embodiments are available to those of ordinary skill in the art. The disclosed and undisclosed embodiments are not intended to limit or restrict the scope or applicability of the invention conceived of by the Applicants, but rather, in conformity with the patent laws, Applicants intend to fully protect all such modifications and improvements that come within the scope or range of equivalent of the following claims.

What is claimed is:

1. A system for regulating and distributing cooling fluid flow through a plurality of heat sinks in thermal communication with one or more electronic devices, the system comprising:
   a system pressure source;
   a flow regulator fluidicly coupled to, and downstream of, the system pressure source;
   a distribution header fluidicly coupled to, and downstream of, the flow regulator;
   a first cooling fluid line fluidicly coupled to, and downstream of, the distribution header;
   a second cooling fluid line fluidicly coupled to, and downstream of, the distribution header;
   a first fixed orifice fluidicly coupled to, and downstream of, the first cooling fluid line; and
   a second fixed orifice fluidicly coupled to, and downstream of, the second cooling fluid line;
   a first heat sink fluidicly coupled to, and downstream of, the first fixed orifice; and
   a second heat sink fluidicly coupled to, and downstream of, the second fixed orifice,
   wherein the fixed orifices include nonadjustable openings there through that are sized so that a first flow rate through the first heat sink and a second flow rate through the second heat sink are uniform with respect to each other regardless of the temperature of the one or more electronic devices; and
   wherein the system further comprises more than one flow regulator downstream of the system pressure source and at least two orifices downstream of each flow regulator.

2. The system of claim 1, wherein the fixed orifices are sized so that a pressure drop across each of the fixed orifices is less than an available system pressure differential at a desired flow rate.

3. The system of claim 1, wherein the fixed orifices are sized so that a pressure drop across each of the fixed orifices is at least 1% greater than a sum of all flow path pressure drop variations.

4. The system of claim 1, further comprising a return line coupled downstream of the heat sinks.

5. The system of claim 1, wherein the system pressure source comprises a compressor or pump.

6. The system of claim 1, further comprising a rack having one or more supporting surfaces for the one or more electronic devices.

7. The system of claim 6, further comprising:
   wherein the rack is configured to house the one or more electronic devices; and
   one or more electronic devices coupled to the rack.

8. The system of claim 1, further comprising:
   the first cooling fluid line's supply end being coupled to the distribution header; and
   the second cooling fluid line's supply end being coupled to the distribution header;
   wherein the first fixed orifice is fluidicly coupled downstream of the first cooling fluid line's supply end and the second fixed orifice is fluidicly coupled downstream of the second cooling fluid line's supply end.

9. The system of claim 1, further comprising wherein at least one of the nonadjustable openings is sized differently from its corresponding cooling fluid line.

10. A method of regulating and distributing cooling fluid flowing through a plurality of flow regulators, a plurality of fixed orifices having nonadjustable openings there through, and a plurality of heat sinks in thermal communication with one or more electronic devices, the method comprising:
    flowing the cooling fluid through the plurality of flow regulators to the plurality of fixed orifices having nonadjustable openings there through, the plurality of fixed orifices including at least two orifices downstream of each of the plurality of flow regulators;
    reducing a flow pressure through the plurality of orifices;
    flowing the reduced pressure cooling fluid through the heat sinks for cooling the heat sinks and absorbing heat from the one or more electronic devices; and
    selecting a size of each of the orifices so that a first flow rate through a first heat sink and a second flow rate through a second heat sink are uniform with respect to each other regardless of the temperature of the one or more electronic devices.

11. The method of claim 10, further comprising creating, at a desired flow rate, a pressure drop across each of the fixed orifices that is less than an available system pressure differential using a pressure source to provide the cooling fluid.

12. The method of claim 11, further comprising creating a pressure drop across each of the fixed orifices that is at least 1% greater than a sum of all flow path pressure drop variations.

13. The method of claim 10, further comprising creating a pressure drop across each of the fixed orifices that is at least 1% greater than a sum of all flow path pressure drop variations in each of flow paths for the fixed orifices that include the heat sinks fluidicly coupled to the fixed orifices.

14. The method of claim 10, further comprising flowing the cooling fluid back to the system pressure source.

15. The method of claim 10, further comprising pressurizing the cooling fluid with a pressure source.

16. A system for regulating and distributing cooling fluid flow through a plurality of heat sinks coupled to one or more electronic devices, the system comprising:
    a system pressure source;
    a first flow regulator fluidicly coupled to, and downstream of, the system pressure source;
    a second flow regulator fluidicly coupled to, and downstream of, the system pressure source, the second flow regulator being configured in parallel with the first flow regulator;
    a first distribution header fluidicly coupled to, and downstream of, the first flow regulator;
    a second distribution header fluidicly coupled to, and downstream of, the second flow regulator;
    a first cooling fluid line fluidicly coupled to, and downstream of, the first distribution header;
    a second cooling fluid line fluidicly coupled to, and downstream of, the first distribution header;
    a third cooling fluid line fluidicly coupled to, and downstream of, the second distribution header;
    a fourth cooling fluid line fluidicly coupled to, and downstream of, the second distribution header;
    a first fixed orifice fluidicly coupled to, and downstream of, the first cooling fluid line; and
    a second fixed orifice fluidicly coupled to, and downstream of, the second cooling fluid line;
    a third fixed orifice fluidicly coupled to, and downstream of, the third cooling fluid line; and
    a fourth fixed orifice fluidicly coupled to, and downstream of, the fourth cooling fluid line; and a first heat sink fluidicly coupled to, and downstream of, the first fixed orifice; and a second heat sink fluidicly coupled to, and downstream of, the second fixed orifice, a third heat sink fluidicly coupled to, and downstream of, the third fixed orifice; and a fourth heat sink fluidicly coupled to, and downstream of, the fourth fixed orifice;

wherein the fixed orifices include nonadjustable openings there through that are sized so that a first flow rate through the first heat sink is uniform with respect to a second flow rate through the second heat sink and a third flow rate through the third heat sink is uniform with respect to a fourth flow rate through the fourth heat sink regardless of the temperature of the one or more electronic devices, accounting for pressure drops across the flow regulators, distribution headers, cooling fluid lines, orifices, and heat sinks at the flow rates.

17. The system of claim 16, wherein the fixed orifices are sized so that a pressure drop across each of the fixed orifices is at least 1% greater than a sum of all flow path pressure drop variations.

18. The system of claim 16, wherein the fixed orifices are sized so that a pressure drop across each of the fixed orifices is at least 5% greater than a sum of all flow path pressure drop variations.

19. The system of claim 16, wherein each of the fixed orifices are sized so that the first flow rate through the first heat sink equals the second flow rate through the second heat sink and the third flow rate through the third heat sink equals the fourth flow rate through the fourth heat sink.

\* \* \* \* \*